United States Patent [19]

Blackmer

[11] 4,182,930

[45] Jan. 8, 1980

[54] DETECTION AND MONITORING DEVICE

[75] Inventor: David E. Blackmer, Wilton, N.H.

[73] Assignee: DBX Inc., Newton, Mass.

[21] Appl. No.: 885,393

[22] Filed: Mar. 10, 1978

[51] Int. Cl.² .......................... H04R 3/00; H04R 5/04
[52] U.S. Cl. .................................. 179/1 R; 179/1 D; 179/1 G
[58] Field of Search ....... 179/1 R, 1 D, 1 G, 15.55 R; 84/DIG. 11

[56] References Cited

U.S. PATENT DOCUMENTS

| | | | |
|---|---|---|---|
| 2,379,714 | 7/1945 | Hollingsworth | 179/1 R |
| 2,408,692 | 10/1946 | Shore | 179/15.55 R |
| 3,127,476 | 3/1964 | David | 179/15.55 R |
| 3,281,533 | 10/1966 | Pflager et al. | 179/1 G |
| 3,842,702 | 10/1974 | Tsundoo | 84/DIG. 11 |

Primary Examiner—Douglas W. Olms
Attorney, Agent, or Firm—Schiller and Pandiscio

[57] ABSTRACT

An improved audio signal processing system synthesizes from an audio signal, an enhanced audio signal by sensing signal energy of the audio signal within a preselected frequency portion of the audio signal, dividing the sensed signal energy into a plurality of discrete bands according to the frequency thereof and generating, responsively to the signal energy in each of the bands, a like plurality of second signals each of which includes frequency components which are subharmonics of the frequencies of the corresponding frequency band. The second signals are combined so as to provide a combined signal and the latter is added to the audio signal to provide the enhanced audio signal.

16 Claims, 7 Drawing Figures

DETECTION AND MONITORING DEVICE

The present invention relates to audio signal processing systems and more particularly to the generation of audio subharmonic frequency signals for improved audio signal reproduction.

For various reasons, including limitations of known recording and transmission techniques as well as limitations of recording and transmission media, a great deal of the signal energy in the bass tonal range of frequencies, i.e., between about 20-50 Hz, is lost when audio signals are reproduced after recording or transmission. For greater quality and truer reproduction, it is therefore desirable to synthesize or manufacture the signal energy within this frequency range when the nature of the audio program admits, i.e., when it is likely that this energy was present in the original recorded or transmitted signal. One system, which has been suggested, feeds the entire audio signal into a frequency divider, e.g., a divide-by-two flip-flop, so as to divide the frequency of each component of the original signal in two. Thus, where the input is a 120 Hz signal component the output should be a digital signal having a pulse repetition rate of 60 pulses per second. The digital signal output of the flip-flop is then provided to a multiplier where it is used to modulate the original audio signal. Although this technique works reasonably well when the original audio signal contains only a single frequency component, more often the original signal contains many frequency components. Thus, a complex waveform is typically applied to the divide-by-two flip-flop generating a rather complex digital signal which in turn is used to modulate the original signal producing waveforms which are even more complex.

It is an object of the present invention to provide an improved audio signal processing system for enhancing the signal energy in the predetermined range of frequencies of an audio signal when the nature of the audio program suggests that such energy was present in the original program.

Another object of the present invention is to provide an improved audio signal processing system for manufacturing select subharmonic frequency components of an audio signal, regardless of the latter's complexity.

Yet another object of the present invention is to provide an improved audio signal processing system for synthesizing frequency components within a predetermined range of frequencies and adding the components to the processed signal so as to enhance that portion of the processed signal.

These and other objects of the present invention are achieved by a system which senses the signal energy of an audio signal within a predetermined frequency range of the audio signal dependent upon the range of frequencies in which signals are to be synthesized. The sensed signal energy is further divided into a plurality of components of discrete, very narrow, frequency bands so that each component can be used to generate a subharmonic signal of the component. The subharmonic signals are then added to the original audio signal.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a further understanding of the nature and objects of the present invention, reference should be had to the following detailed description taken in connection with the accompanying drawings wherein.

Throughout the various drawings, the same numerals are used to designate like parts.

Figure 1:
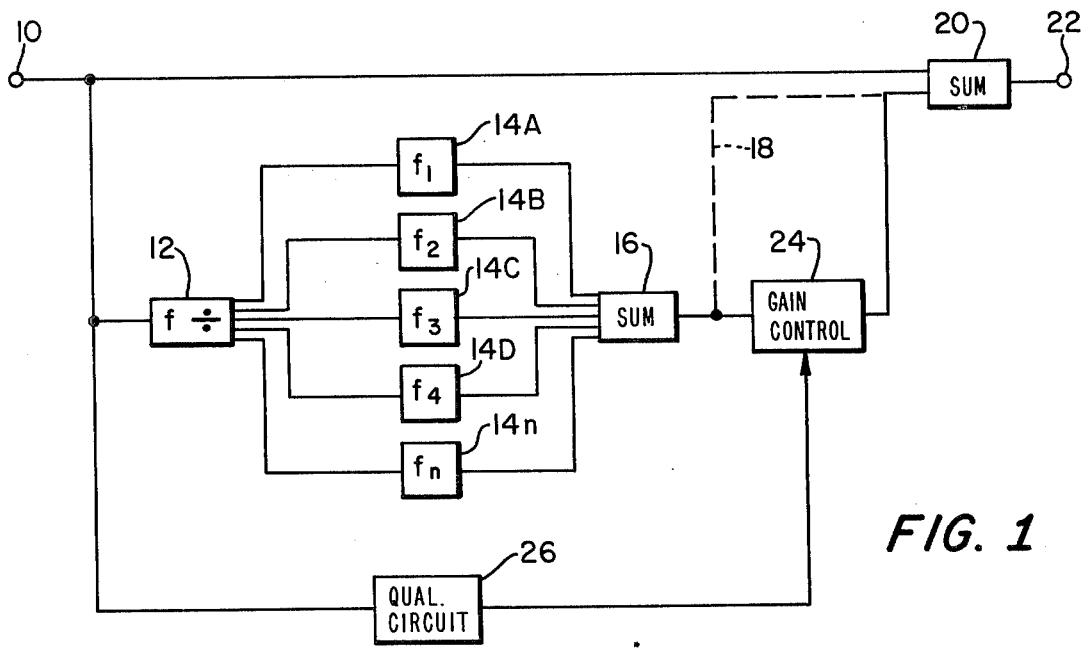
FIG. 1 is a block diagram of the preferred embodiment of the present invention.

A monophonic audio signal processing system incorporating the principles of the present invention is shown in FIG. 1 and includes an input terminal 10 for receiving the audio signal being processed. The terminal 10 is connected to signal sensing means 12 for sensing signal energy within a preselected frequency portion (e.g., 40-100 Hz) of the audio signal at terminal 10 and for dividing the sensed signal energy into a plurality (i.e., n) of discrete frequency bands. Sensing means 12, accordingly, has a plurality of outputs each transmitting the signal energy within a particular frequency band. Preferably, the bands are of bandwidths which are relatively narrow, and are contiguous with one another. When generating signals in the bass tonal region, bandwidths of 10 Hz have been found to be satisfactory. Thus, where the portion of the audio signal of interest is between 40 and 100 Hz, the sensing means 12 divides the portion sensed into six bands, (i.e., n=6) each of 10 Hz width (i.e., the first being 40-50 Hz, the second 50-60 Hz, the third 60-70 Hz, the fourth 70-80 Hz, the fifth 80-90 Hz and the sixth 90-100 Hz). Each output is connected to signal generating means 14, which is responsive to the signal energy in the particular band and generates a signal which includes frequency components which are subharmonics of the frequencies of the corresponding frequency band provided at its input. Thus, for example, where the signal energy at the input of generating means 14A is within a frequency band of 40-50 Hz, the output signal of generating means 14A will include frequency components which are subharmonics of 40-50 Hz. In the preferred embodiment, the subharmonics generated are each essentially one-half the frequencies of the signal applied to the input of the particular generating means 14, however it will be appreciated that other subharmonic frequencies can be generated such as those essentially one-third the frequencies of the signal applied to the input as will be described with respect to FIG. 5, hereinafter. Thus, in the preferred embodiment where the input to generating means 14A is between 40-50 Hz, the output will be signals having frequencies between 20-25 Hz. Similarly, where the input to generating means 14B is between 50-60 Hz, the output of generating means 14B is between 25-30 Hz, etc. The outputs of all the generating means 14 are summed through the summing means 16 for combining the signals. Generally, as shown by dotted line 18, the output of combining means 16 can be connected directly to summing means 20 for adding the output signal of combining means 16 to the original audio signal so as to provide an enhanced audio signal at the output terminal 22. Preferably, however, the output of means 16 is connected to amplifying means 24 for amplifying the combined signal output of summing means 16. Amplifying means 24 preferably is of a type which amplifies the combined signal output of summing means 16 by a gain variable responsive to a control signal provided from the qualification circuit 26. The latter preferably includes sensing means for sensing the same portion of audio signal sensed by sensing means 12 (i.e. signal energy within the frequency bandwidths f1-fn) and generates the control signal at a value which is logarithmically related to the amplitude, i.e., preferably the RMS value, of the sensed portion. When the level of the control signal is sufficient, as determined by amplifying means 24, the output of summing means 16 is amplified in accordance with the value of the control signal.

In operation as the audio signal is applied to the input terminal 10, the predetermined frequency portion is sensed by the sensing means 12 and the RMS value of the amplitude of this portion of the signal is sensed by level sensor of qualification circuit 26. The signal energy sensed by sensing means 12 is divided into the frequency bands and generating means 14, each generate signals including the subharmonic frequencies of the corresponding frequency band of the corresponding input. The signal outputs of generating means 14 are summed by summing means 16, amplified by amplifying means 24 by a gain depending on the control signal generated by qualifying circuit 26. It is noted that the amplitude of the control signal is dependent on the RMS value of the signal sensed within the frequency bandwidths of interest in order to provide amplification of the output of summing means 20. The amplified output of amplifying means 24 is then added to the audio signal by summing means 20 to provide an enhanced audio signal at the output terminal 22. By dividing the signal sensed by means 12 into a plurality of discrete narrow bandwidths, the waveform of the input to each generating means 14 is kept rather simple, enabling subharmonics to be more easily generated.

Figure 2:
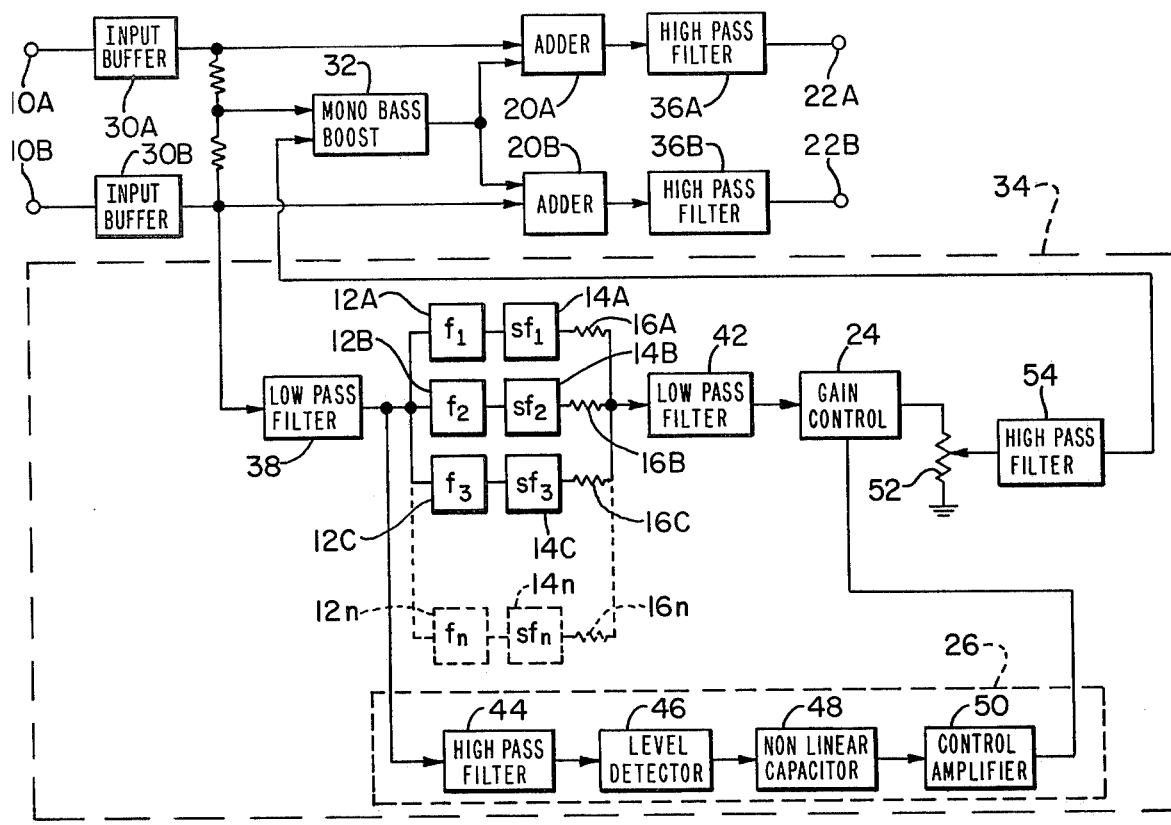
FIG. 2 is a block diagram of the preferred embodiment of the present invention for enhancing the bass portions of stereophonic signals.

The principles of the present invention can be utilized in an audio signal processing system for stereophonic use to enhance the bass tonal range of a stereophonic audio signal. The preferred stereophonic system is shown in FIG. 2 and includes two input terminals 10A and 10B, respectively receiving two stereophonic audio signals. The inputs, 10A and 10B, are connected, respectively, to the input buffers 30A and 30B which are preferably isolation amplifiers for reducing the impedance level of the source of the inputs. The outputs of buffers 30A and 30B are each connected to the input of a corresponding signal summing means 20A and 20B. The outputs of buffers 30A and 30B are also summed to provide a monophonic signal which is applied to the input of a monophonic bass boost and combiner circuit 32 as well as to the input of synthesizing circuit 34. The latter produces subharmonic signals in the bass tonal region of interest which are applied to a second input of the circuit 32. The circuit 32 accordingly applies a monophonic output signal which includes the manufactured subharmonic base signals provided by synthesizing circuit 34 to the second inputs of the summing means 20A and 20B. Summing means 20A and 20B add the monophonic signal having the manufactured bass to each of the stereo channels. The outputs of the summing means 20A and 20B are respectively applied to the inputs of high pass filters 36A and 36B. The latter are preferably "rumble" filters adapted to remove noise associated with "turntable rumble" from the signals being processed and provide the enhanced stereophonic audio signals at the output terminals 22A and 22B.

Synthesizing circuit 34 includes a low pass filter 38 for receiving the monophonic sum of the outputs of buffers 30A and 30B. Filter 38 is designed to reject all energy above the upper limit of the frequencies of interest. In the preferred embodiment filter 38 is accordingly designed to reject all signal energy above about 100 Hz.

In order to generate the subharmonics the output of low pass filter 38 is divided into a plurality of discrete narrow, contiguous, frequency bands, so that signal components thus provided can be used to manufacture subharmonics of those particular signal components. Specifically, the output of filter 38 is also applied to the inputs of a plurality of bandpass filters 12A, 12B...12n, each having a band pass characteristic of the bandwidth of interest. Thus, where the output of filter 38 is all signal energy below 100 Hz, the portion of the signal of interest is about 40-100 Hz, and each bandwidth is 10 Hz, filter 12A will pass the signal energy between 40-50 Hz, filter 12B the signal energy between 50-60 Hz, etc. The outputs of filters 12 are connected to the inputs of a like plurality of subharmonic generators 14, each being responsive to that portion of the output of filter 12 within the very narrow frequency band passed by the filter. Thus, in the above example, where the portion of the audio signal is divided into six bands, six different subharmonic generators 14 for generating subharmonic frequencies, each essentially one-half an original frequency, are utilized. The first generator 14A is responsive to this signal energy from filter 12A between 40 and 50 Hz so as to generate subharmonic signals between about 20 and 25 Hz. Generator 14B is responsive to the signal energy between about 50 and 60 Hz from filter 12B for generating subharmonic signals between about 25 and 30 Hz. Similarly, the last four generators are preferably respectively responsive to signal energy between 60-70 Hz, 70-80 Hz, 80-90 Hz, and 90-100 Hz, for generating subharmonics between 30-35 Hz, 35-40 Hz, 40-45 Hz, and 45-50 Hz, respectively. The outputs of generators 14 are summed through summing means in the form of resistors 16. As will be evident hereinafter in addition to generating the subharmonics of interest, in the preferred embodiment generators 14 also generate signals which are at frequencies three halves of the original frequency. Accordingly, the outputs of generators 14, are added through summing resistors 16, and then applied to the input of low pass filter 42. Low pass filter 42 is designed to reject the three halves component of the output of the generators 14 so that the output of filter 42 includes only the subharmonics at one-half the original frequencies. The output of filter 42 is connected to the amplifying means 24 in the form of a gain control module 24. The latter amplifies or controls the gain of the signal output of filter 42 in proportion to the weighted control signal provided from the qualification circuit 26, the latter preferably comprising high pass filter 44, detector 46, nonlinear capacitor 48 and control amplifier 50.

The qualification circuit 26 is adapted to receive the output of low pass filter 38. The output of filter 38 is fed to high pass filter 44, which rejects all signal energy below the minimum frequency of interest (in the preferred embodiment this minimum frequency being 40 Hz). The output of high pass filter 44 is therefore only signal energy from the two channels between the two frequencies of interest, 40 and 100 Hz.

The output of filter 44 is fed to a level detector 46, the latter preferably being of the RMS type. The output to the detector is therefore the RMS value of all energy within the frequency band of interest appearing at the input of the detector. Detector 46 is designed to provide an output through nonlinear capacitor 48 to the control amplifier 50. Nonlinear capacitor 48 is of a type which provides a large capacitive value for slowly varying signals during normal operation. If a sudden change in the bass level occurs, the nonlinear capacitor, however, provides the dynamics to allow a rapid change in the synthesizing process, and therefore provides a fast response should a sudden change occur. Control amplifier 50 provides an output signal to the control terminal of a gain control module 24. As will be more evident hereinafter, qualifying circuit 26 together with module 24 determine whether a sufficient amount of energy is present within the frequency range of interest, i.e. between 40 and 100 Hz, and to control the amount of amplification of the subharmonics generated. Further, the preferred RMS detector 46 provides a type of amplification control signal regardless of the complexities of the oroginal waveforms of the audio signals at input terminals 10A and 10B. The output of module 24 is applied through a variable resistor 52 to the input of a high pass filter 54. Variable resistor 52 is provided to adjust the amplitude of the manufactured subharmonics which are to be added to the signals in each stereo channel. High pass filter 54 is designed to remove any noise below the manufactured bass, i.e. 25 Hz, which may be generated by the synthesizing circuit. The output of filter 54 is applied to the input of combiner circuit 32 whereupon it is subsequently added to each channel through the summing means 20A and 20B.

Figure 3A:
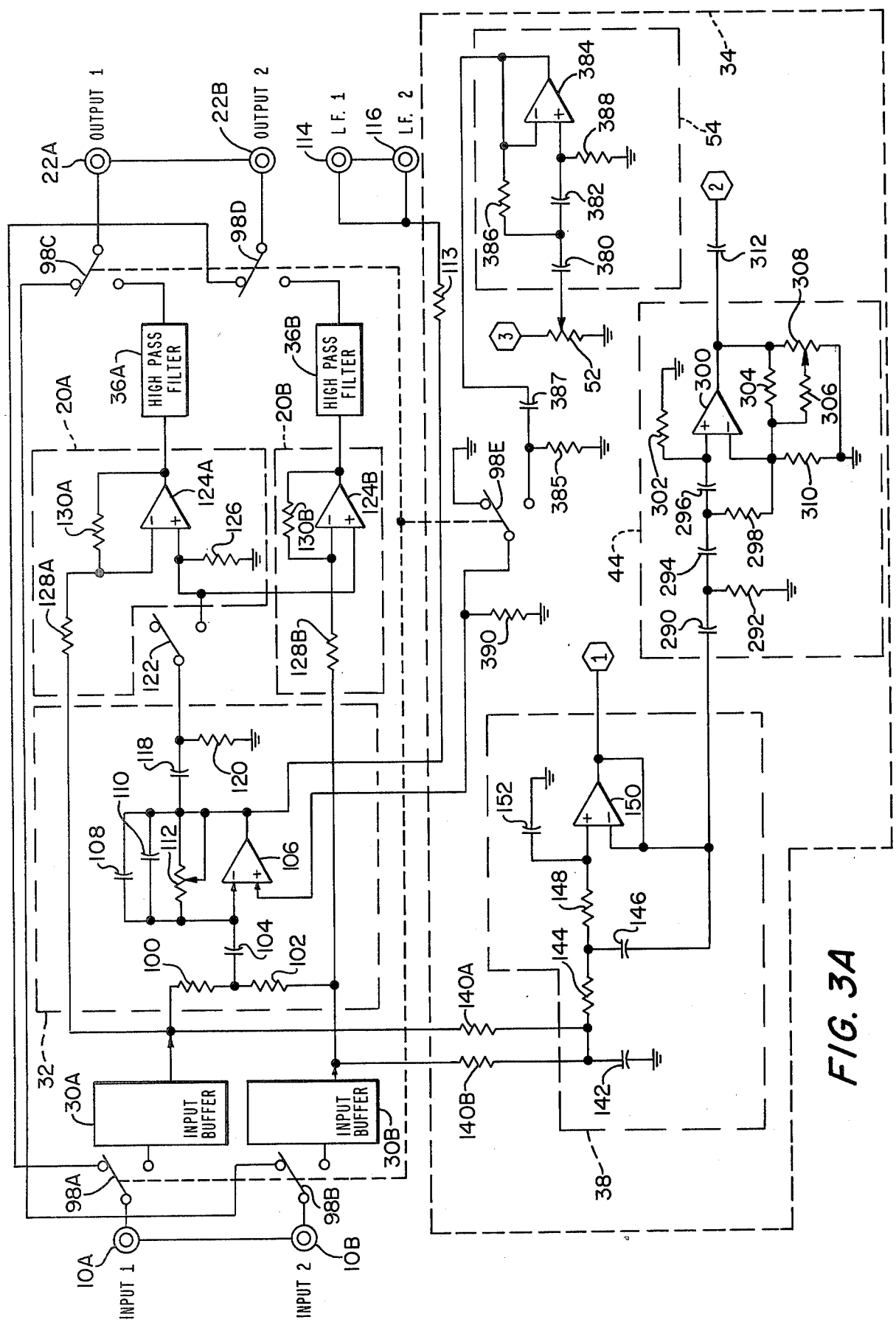
FIG. 3A and 3B are a more detailed, partial block and partial schematic diagram of the embodiment of FIG. 2.
Figure 3B:
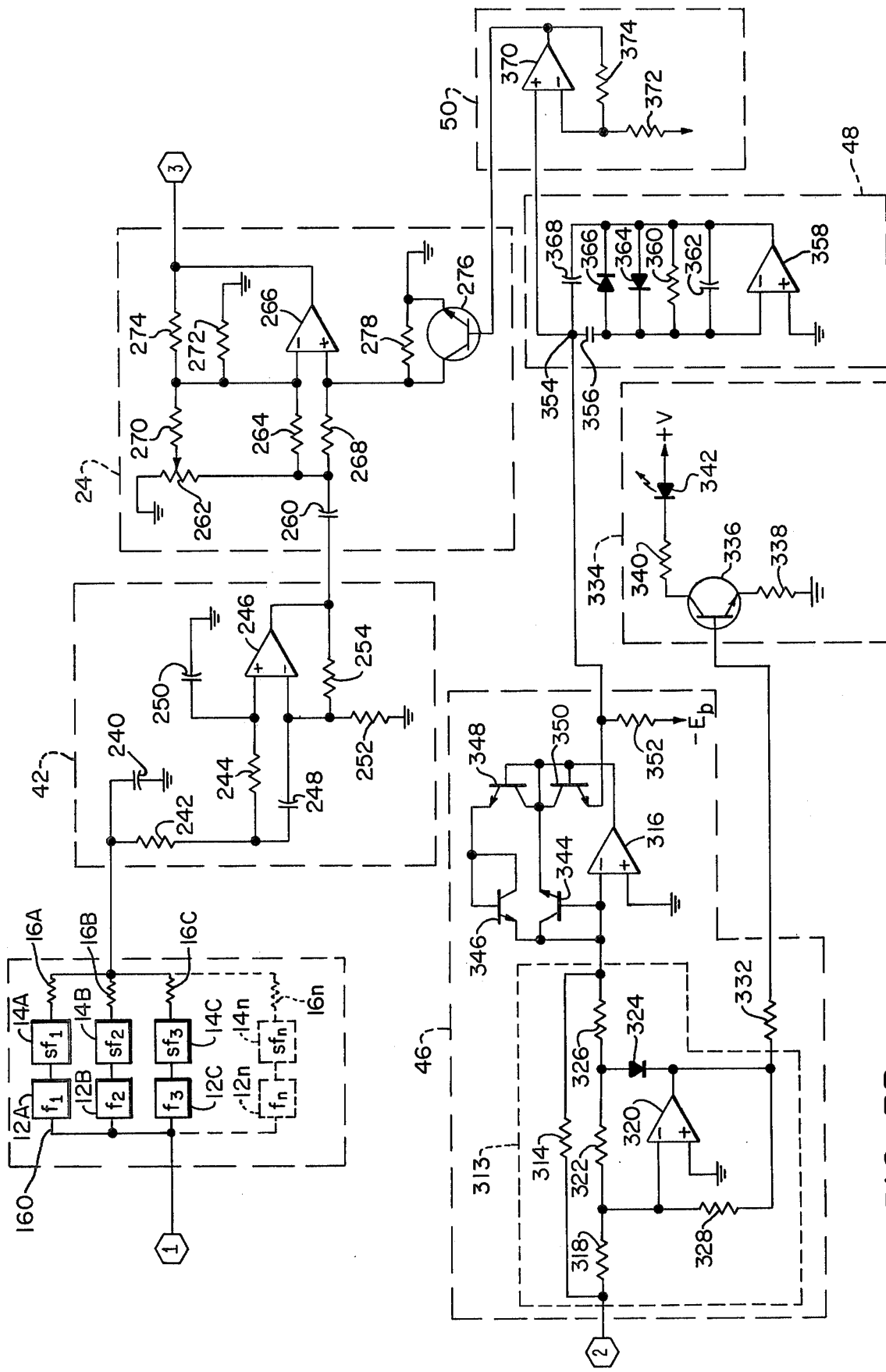

The preferred embodiment of FIG. 2 and various additional advantages will be more clearly understood with reference to FIGS. 3A and 3B. For ease of exposition the schematic circuit of FIG. 3 has been divided into two figures, 3A and 3B with the numbered hexagonal points in the circuit schematic of FIG. 3A corresponding to the same numbered hexagonal points in the schematic of FIG. 3B. As shown in FIG. 3A, the inputs 10A and 10B are connected through two contacts 98A and 98B of a ganged five-contact switch to the inputs of buffers 30A and 30B, which in turn are summed together and connected to the input of the combiner circuit 32. The latter includes the voltage divider comprising resistors 100 and 102. The junction of resistors 100 and 102 is connected to the capacitor 104, which in turn is connected to the negative input of operational amplifier 106. The positive input of amplifier 106 is connected to receive the output of synthesizing circuit 34. The negative input of operational amplifier 106 is connected to its output through each capacitor 108, capacitor 110 and variable resistor 112. The contact of variable resistor 112 is connected directly to the output of amplifier 106 so that the amount of feed back resistance can be varied for reasons which will be described hereinafter. The output of combiner circuit 32 is connected through resistor 113 to the outputs 114 and 116 to enable the listener to detect the manufactured bass provided at the output of combiner circuit 32. The output of combiner circuit 32 is also connected through capacitor 118, which in turn is connected to resistor 120 (the latter being grounded) and switch 122. Switch 122 is provided to disconnect the combiner circuit when manufactured bass is not desired. Switch 122 is in turn connected to summing means 20A and 20B so that the manufactured bass can be added to each stereo channel. Specifically, the output of combiner circuit 32 is connected through switch 122 to the positive input of operational amplifiers 124A and 124B of the summing means 20A and 20B, respectively. The positive inputs are biased with respect to ground through resistor 126. The negative inputs of operational amplifier 124A and 124B are connected to receive the audio signals from the input buffers 30A and 30B through resistors 128A and 128B, respectively. The negative inputs of operational amplifiers 124A and 124B are connected to their outputs through feedback resistors 130A and 130B, respectively.

The outputs of operational amplifiers 124A and 124B are connected to the inputs of high pass filters 36A and 36B, respectively. The outputs of high pass filters 36A and 36B are connected through switches 98C and 98D to the output terminal 22A and 22B, respectively. Switches 98C and 98D, which are ganged together with the switches 98A and 98B, provide a bypass for transmitting the inputs at input terminals 10A and 10B directly to the output terminals 22A and 22B when the ganged switches are in one position and to utilize the entire circuit when in a second position.

The output of input buffers 30A and 30B are also summed together through resistors 140A and 140B, respectively, to the input of low pass filter 38 of the synthesizing circuit 34. The input of low pass filter 38 is connected to capacitor 142 (which in turn is connected to ground) and to resistor 144. Resistor 144 is, in turn, connected to both capacitor 146 and resistor 148. Capacitor 146 is in turn connected to the negative input of operational amplifier 150 and is also connected directly to the output of operational amplifier 150. Resistor 148 is in turn connected to the positive input of amplifier 150 and connected through capacitor 152 to ground.

Figure 4:
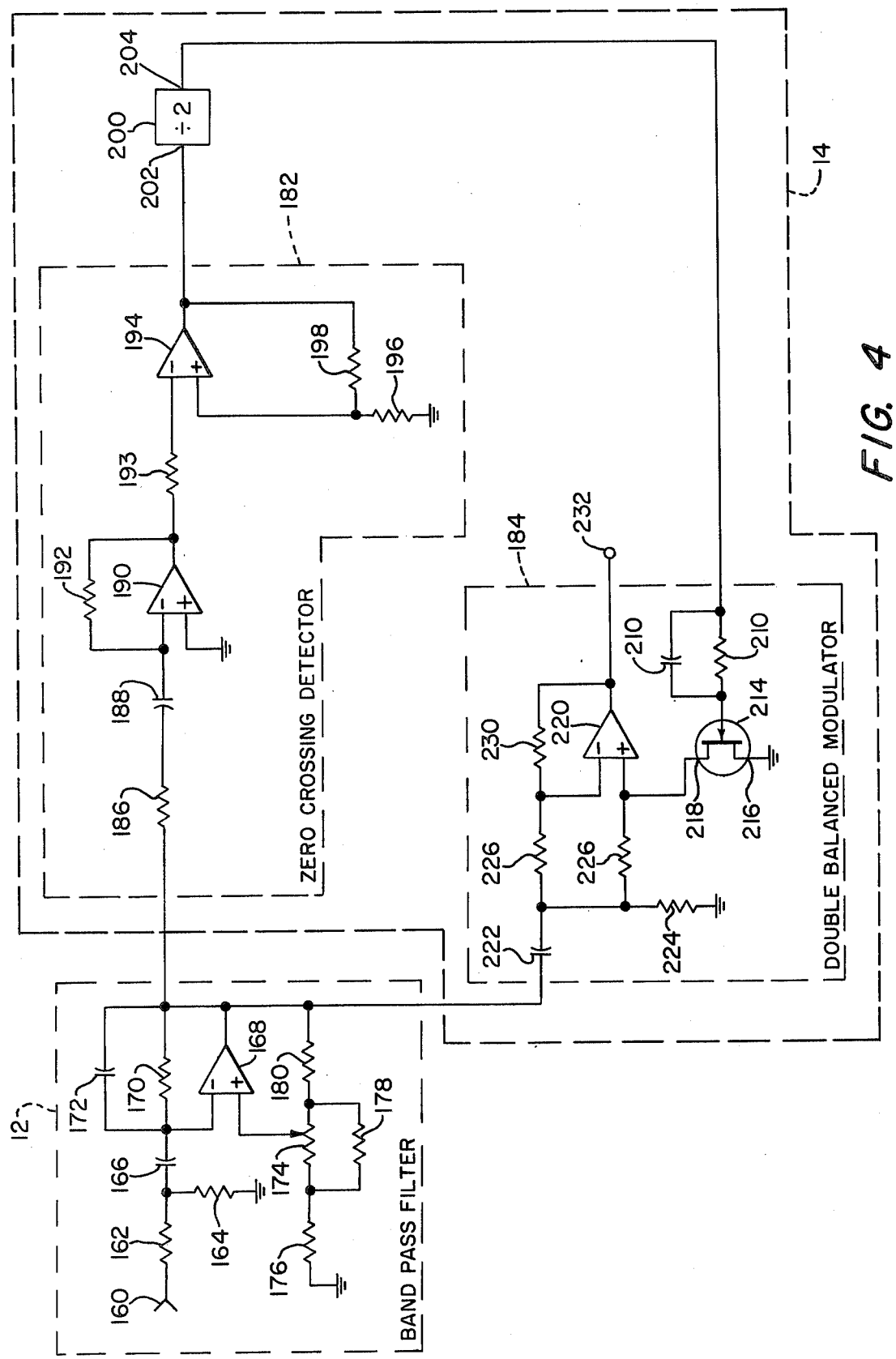
FIG. 4 is a schematic drawing of one embodiment of a bandpass filter and subharmonic frequency generator useful in the FIG. 3 embodiment for generating subharmonic frequencies equal to one half the original frequencies.

The output of amplifier 150 is connected (as shown in FIG. 3B) to the filters 12. Each filter 12 is connected to a corresponding subharmonic generator 14. A filter 12 and generator 14 for generating subharmonic frequencies at one-half the original frequencies is shown in greater detail in FIG. 4. It will be appreciated that each filter 12 and generator 14 is identical with the exception of slight variations in the values of the resistors and capacitors dependent on the frequency bands of interest which will be obvious to one skilled in the art. Specifically, as shown in FIG. 3B, the output from amplifier 150 of filter 38 is applied to input 160 of filter 12. Input 160 is connected to the other inputs of the other filters. Referring to FIG. 4, input 160 is connected to resistor 162 which in turn is connected to ground through resistor 164 and connected through capacitor 166 to the negative input of operational amplifier 168. The negative input of amplifier 168 is connected through feedback resistor 170 and through feedback capacitor 172 to the output of amplifier 168. The positive input of amplifier 168 is connected to the tap of variable resistor 174. One side of resistor 174 is connected through resistor 176 to ground and is connected through resistor 178 to its other side. The other side of resistor 174 is also connected to resistor 180 to the output of amplifier 168.

Variable resistor 174 is adjustable to adjust the Q of filter 12. The output of amplifier 168 forms the output of filter 12 and is connected to the input of generator 14.

The input of generator 14 is connected to zero crossing detector 182 and is also connected to the +1 gain circuit, which in the preferred embodiment takes the form of double balanced modulator 184. Detector 182 may be a comparator, slicer, squarer or similar device. Preferably the input of zero crossing detector 182 is connected to resistor 186 which in turn is connected to capacitor 188. Capacitor 188 is in turn connected to the negative input of operational amplifier 190. The negative input of amplifier 190 is connected through feedback resistor 192 to the output of the amplifier while the positive input of the amplifier is connected to ground. The output of amplifier 190 is connected through resistor 193 to the negative input of operational amplifier 194. The positive input of operational amplifier 194 is connected through resistor 196 to ground and through resistor 198 to the output of the amplifier 194. The output of amplifier 194 is connected to the input of the frequency divider 200. The latter preferably is a divide-by-two flip flop which is well known in the art and thus will not be described in detail. Generally, the frequency divider 200 provides at its output terminal 204 a digital signal having a pulse repitition rate equal to one half the frequency of the signal provided at its input terminal 202.

The output terminal 204 of the frequency divider 200 is connected to the input of double balance modulator 184. The input of modulator 184 is connected through resistor 210 and through capacitor 212 to the gate terminal of switching transistor 214. Switching transistor 214 is of a type well known in the art and preferably is an FET transistor. As well known in the art when a positive control signal is provided to the gate terminal, the transistor becomes conductive between its main terminals 216 and 218, and when a negative control signal is provided to the gate terminal the transistor 214 becomes nonconductive. Terminal 216 is connected to ground, while terminal 218 is connected to the positive input of operational amplifier 220. The balanced modulator 184 is adapted to receive an input from filter 12 through capacitor 222 to the junction of resistor 224 (which is in turn connected to ground) and resistor 226. The latter is connected to the positive input of operational amplifier 220. Capacitor 222 is also connected through resistor 228 to the negative input of operational amplifier 220. The negative input of the amplifier is connected through feedback resistor 230 to the output of operational amplifier 220 which in turn is connected to output terminal 232. Output terminal 232 is connected to the summing resistor 16 shown in FIG. 3B.

Referring again to FIG. 3B, as shown in the preferred embodiment, the outputs of each double balanced modulator of the generating means is connected through a corresponding resistor 16 to the input of low pass filter 42. The input of low pass filter 42 is connected to capacitor 240 for shunting high frequency components to ground. In order to provide a greater rolloff the input of filter 42 is also connected to resistor 242, which in turn is connected through resistor 244 to the positive input of operational amplifier 246 and through capacitors 248 to the negative input of operational amplifier 246. The positive input of operational amplifier 246 is connected through capacitor 250 to ground. The negative input of operational amplifier 246 is connected through resistor 252 to ground and through resistor 254 to the input of module 24.

The input of module 24 is connected through capacitor 260 which in turn is connected through variable resistor 262 to ground, through resistor 264 to the negative input of operational amplifier 266, and through resistor 268 to the positive input of operational amplifier 266. The negative input of operational amplifier 266 is connected through resistor 270 to the tap of variable resistor 262, through resistor 272 to ground, and through resistor 274 to its output, which in turn forms the output of module 24. The positive input of operational amplifier 266 of module 24 is connected to the collector of NPN transistor 276. Transistor 276 has its collector connected to its emitter through resistor 278. The emitter in turn is connected to ground. The base of transistor 276 is connected to receive the output of control amplifier 50 of the qualification circuit 26.

Referring to FIG. 3A, the qualification circuit is connected so as to receive the output of low pass filter 38. More specifically, the output of operational amplifier 150 of filter 38 is connected to the input of high pass filter 44. The input of filter 44 is connected to capacitor 290 which in turn is connected through resistor 292 to ground and through capacitor 294 to the junction of capacitor 296 and resistor 298. Capacitor 296 is in turn connected to the positive input of operational amplifier 300 and through resistor 302 to ground. Resistor 298 is connected to the negative input of operational amplifier 300 through feedback resistor 304 to the output of amplifier 300, through resistor 306 to the tap of variable resistor 308 and through resistor 310 to ground. The output of operational amplifier 300 is connected through variable resistor 308 to ground and to capacitor 312 the input of detector 46. Shown in FIG. 3B.

Referring to FIG. 3B, detector 46 is preferably the type that senses the RMS value of the signal level on capacitor 312 and provides a control signal at its output dependent upon the value at its input. Such detectors are well known in the art. See, for example, U.S. Pat. No. 3,681,618 issued to David E. Blackmer on Aug. 1, 1972.

The preferred detector however, is shown in FIG. 3B where the input of detector 46, i.e. the signal capacitor 312 (shown in FIG. 3A) is connected to the input of operational rectifier 313, through resistor 314 to the negative input of operational amplifier 316. The input of detector 46 is also connected through resistor 318 of rectifier 313 to the negative input of operational amplifier 320. The negative input of operational amplifier 320 is connected through resistor 322 to the anode of diode 324 and to resistor 326, the latter being connected to the negative input of operational amplifier 316. The cathode of diode 324 is connected to the output of operational amplifier 320. The positive input of operational amplifier 320 is connected to ground. Additionally, the negative input of operational amplifier 320 is connected through resistor 328, which in turn is connected to the output of amplifier 320 and to the cathode of diode 324. The output of amplifier 320 of rectifier 313 is connected through resistor 332 to the synthesizer indicator 334, an optional feature of the present embodiment.

Indicator 334 includes NPN transistor 336 having its base connected to resistor 332 of detector 46, its emitter connected through resistor 338 to ground and its collector connected through resistor 340 to the light emitting diode 342, which in turn is connected to a positive voltage source. Essentially, indicator 334 is designed to provide energization to diode 342 when the subharmonic frequencies are being generated.

Referring again to detector 46, the positive input of operational amplifier 316 is connected to ground, while the negative input is connected to the base and collector of transistor 344 and to the emitter of transistor 346. The base and collector of transistor 346 are tied together and to the emitter of transistor 348. The base and collector of transistor 348 and 350 as well as the emitter of transistor 344 are all connected together at the output of operational amplifier 316. The emitter of transistor 350 is connected to a negative DC bias through resistor 352. The emitter of resistor 350 is also connected to the input of nonlinear capacitor 48.

The latter allows very long smoothing constants to apply to the control voltage signal provided at the output of detector 46, for steady state or slowly varying signals, so as to substantially reduce the amount of ripple at the output, thus adding very little distortion to the audio signal; and at the same time allow very rapid signal changes to effect similarly rapid changes of the same control voltage signal at the output of the sensor, thus allowing for the enhancement of transient attack signals. Nonlinear capacitor 48 has its input 354 adapted to receive the output of detector 46. Junction 354 is connected to a first capacitor 356 to the inverting input of operational amplifier 358, the latter having its positive input connected to system ground. The output of operational amplifier 358 is connected to its inverting input through resistor 360 and through capacitor 362. The output of operational amplifier 358 is also connected to the anode of diode 364 and to the cathode of diode 366, both diodes preferably being silicon diodes. The cathode of diode 364 and the anode of diode 366 are, in turn, also connected to the inverting input of operational amplifier 358. The output of operational amplifier 358 is also connected through capacitor 368 to junction 354. For optimum results, the resistor 360 is preferably of a relatively large value so as to provide a reasonable voltage bias between the inverting input and output of operational amplifier 358.

It will be appreciated that the gain of the operational amplifier 358 of the nonlinear capacitor 48 (gain being defined as the ratio of the peak-to-peak voltage at the output of amplifier 358 over the desired ripple voltage at the junction 345) is the ratio of the impedance of capacitor 356, C356 and the impedance of capacitor 362, C362. These impedances however change with frequency. It has been found that for optimum performance, the ratio of the capacitances i.e., C356/C362, is greater than or equal to about 100. It will be appreciated that the effect of capacitance of nonlinear capacitor 48 is a function of the gain of operational amplifier 358, which in turn, is a function of how quickly the voltage level is changing at junction 354. For steady state conditions or very slow changing signal levels at junction 354, diodes 364 and 366 will remain substantially nonconductive, and because of biasing resistor 360, the gain of operational amplifier 358 remains substantially high and thus, the effective capacitance is large. For example, where the gain of operational amplifier 358 is 100, a one db change at junction 354 (equivalent to about 6 millivolts) provides a 600 millivolt change at the output of operational amplifier 358, a change which is insufficient to make the diodes 364 and 366 conduct and thus the effective capacitance is rather large. However, as the slew rate at junction 354 increases, the output of the operational amplifier increases 100 fold whereupon the diodes will begin to conduct. As the diodes become more and more conductive, the current through either diodes 68 or 70 (depending upon whether the voltage changes in a positive or negative sense) increases so that in effect, the gain of the operational amplifier decreases so as to lower the effective capacitance of nonlinear capacitor 48.

The junction 354 of nonlinear capacitor 48 is connected to the positive input of operational amplifier 370 of the control amplifier 50. The negative input of operational amplifier 370 is connected through resistor 372 to ground and through resistor 374 to the output of operational amplifier 370. The output of operational amplifier 370 is also connected to the base of transistor 276 of the gain control amplifier 24 in order to control the amount of amplification of the signal provided at the input of module 24 from low pass filter 42 at the hexagonal point 3.

Referring to FIG. 3A, the output of module 24 at hexagonal point 3 is connected through the variable resistor 52 to ground. The tap of resistor 52 is connected to the input of high pass filter 54. The input of high pass filter 54 is connected to capacitor 380 which in turn is connected through capacitor 382 to the positive input of amplifier 384, and through resistor 386 to the negative input of operational amplifier 384. The positive input of operational amplifier 384 is connected through resistor 388 to system ground while the negative input is connected to its output. The output of operational amplifier 384 is connected through capacitor 387, which in turn is connected through resistor 385 to ground and through switch 98E (the latter being ganged together with switches 98A, 98B, 98C and 98D) to the positive input of operational amplifier 106 of the combiner circuit 32, the positive input of the latter being biased to ground with resistor 390.

In operation switch 98 is positioned for operation of the subharmonic frequency generating circuit so that two channel stereophonic signals applied to the respective input terminals 10A and 10B will be conducted to the input buffers 30A and 30B. The output of buffers 30A and 30B are summed through resistors 100 and 102 of combiner circuit 32 to provide a monophonic signal through capacitor 104 to the negative input terminal of operational amplifier 106. Amplifier 106 adds this monophonic signal with the manufactured base provided by synthesizing circuit 34 at the positive input terminal of amplifier 106. The output signal of amplifier 106 therefore represents the sum of the input signals at its negative and positive input terminals and is amplified by a gain which is dependent upon the setting of variable resistor 112. Variable resistor 112 not only sets the gain of the amplifier but also sets the "frequency turnover" of the combiner circuit. Specifically, the variable resistor 112 is adjustable between a position where no gain is provided to a position where maximum gain is provided. It has been determined that when little low frequency content is present in the audio signals it indicates that what energy is present is at very low frequencies. Thus, by increasing the gain of amplifier 106 by varying the resistance of variable resistor 112, one is simultaneously lowering the frequency turnover of the filter provided by the feedback paths of the amplifier 106. Where it is desired to adjust the output of amplifier 106, and in particular to adjust the contour of the signal by adjusting the resistor 112, the listener can easily hear the monophonic output of amplifier 106 which includes the manufactured bass frequencies, at the output terminals 114 and 116. The outputs of buffers 30A and 30B are also applied through the resistors 140A and 140B to the input of low pass filter 38. The latter essentially is designed to reject high frequency energy above 100 Hz. The output of the low pass filter is then fed to each of the band pass filters 12 which in turn provide an output to the corresponding zero crossing detector 182 and to double balanced modulator 184 of the generator 14. The output of detector 182 is essentially a digital output signal having a pulse repetition rate substantially equal to the frequency of the output signal of filter 12. The output of detector 182 is applied to the input terminal 202 of flip flop 200. The output of flip flop 200 is a digital signal having a pulse repetition rate equal to one half the pulse repetition of the output of detector 182. The output of flip flop 200 is applied to the gate terminal 214. When the output is positive the positive input of amplifier 220 of modulator 184 is shunted to ground. This has the effect of modulating the original input signal from filter 12. As well known, double balanced modulators are devices in which the carrier signal, i.e. the output signal of flip flop 200, is suppressed. The output, of such a modulator, however, will have two components, one being a function of the frequency of the input signal (fin), i.e. from filter 12 plus the frequency of the carrier signal from flip flop 200 and a second component in which the frequency will be the frequency of the input signal minus the frequency of the carrier. In this case the carrier input signal is the output of the flip flop which is at a frequency one half the input signal (fin/2). Thus, the output of double balance modulator 184 will have two frequency components, fin/2 and the other 3fin/2. The output of each of the double balance modulators 14 are summed through resistor 16 to the low pass filter 42. The latter is designed to pass the fin/2 component of the output of each of the modulators while rejecting the 3fin/2 components. Thus the output of filter 42 is essentially the subharmonic frequency components that have been generated. These components are applied to the gain control module 24.

In order to determine whether sufficient low frequency energy is present to provide the subharmonics to the main stereo channels through the summing means 20A and 20B, the output of low pass filter 38 is also applied to the qualifying circuit 26. Specifically, the output of filter 38 is applied to high pass filter 44. The latter is adapted to reject all energy below 40 Hz so that the output will be that energy detected between 40 and 100 Hz. It is noted that the threshold output of filter 44 can be adjusted through the variable resistor 308. The output of high pass filter 44 is then fed to the detector 46. It will be appreciated that the input to the detector is all energy from the original signals which is within the frequency band of interest, i.e. between 40 and 100 Hz. If this level is sufficient the detector will provide two outputs. One of the outputs is to the synthesizing indicator 334. An output to the indicator will drive the light emitting diode 342 to indicate to the listener that the bass information is present and that the circuit is manufacturing low frequency subharmonic signals. As well known in the art the detector senses the signal level from the output of high pass filter 44 on a low ripple or ripple free RMS basis so that the output of the detection means is linearly related to its input in decibels. The output of detector 46 is applied to the nonlinear capacitor 48.

The effective capacitance of capacitor 48 is dependent upon the dynamics of the signal at junction 354 as previously described. The signal at junction 354 is applied to the control amplifier 50. The control amplifier 50 amplifies the signal at junction 354 and applies the amplified signal to the base of transistor 276 of the gain control module 24. Where very little energy is present, the output of amplifier 370 of control amplifier 50 is very small so that transistor 276 remains nonconductive. In such a case the values of resistors 268 and 278 with respect to the values of 264 and 262 are such that the signal output of operational amplifier 266 is zero. Specifically, the signals at the positive and negative terminals of operational amplifier 266 remain substantially equal. However, as the amount of bass energy present in the signal increases so that the output of the RMS detector and the output of amplifier 50 increases transistor 276 begins to conduct, reducing the resistance offered by resistor 278. This in turn increases the signal level at the negative input terminal of operational amplifier 266 with respect to the signal level at the positive input terminal of amplifier 266, providing an output of amplifier 266, the amplitude of the output being dependent upon the amount of this difference. Thus, as transistor 276 becomes more and more conductive, less and less current flows through resistor 278 so as to provide a smaller and smaller signal to the positive input terminal of operational amplifier 266 of amplifying means 24. Since the positive and negative gain inputs no longer cancel one another, there is an overall negative gain thereby provided. In this way as the amount of signal energy increases so does the amount of signal amplification. The output of the amplified subharmonic frequency components thereby generated, are transmitted through the variable resistor 52, the latter being varied to adjust the amplitude of the manufactured bass subharmonic frequency components. The signals pass through the variable resistor 52 to high pass filter 54. The latter also is adapted to remove any low frequency noise such as turntable rumble. The output of filter 54 is applied to the input of combiner circuit 32, where it is added to the monophonic sum of the original signal energy provided in both channels. The output of circuit 32 is added to the original stereophonic signals through summing means 20A and 20B. The output of summing means 20A and 20B applied to high pass filters 36A and 36B, the latter removing any low frequency rumble noise which may be present in the signal. The signals thus appearing at terminals 22A and 22B not only include the original signals applied to input terminals 10A and 10B but also subharmonic signals manufactured by the synthesizing circuit 34 which are derived from other low frequency information present in the signal. A richer and therefore enhanced signal is thereby provided in each channel.

Although the invention has been described in its preferred form, it will be evident that various modifications can be made without departing from the scope of the invention. For example, although the ±1 gain circuit is described in the form of double balanced modulator 184, other devices may be substituted for the modulator. By way of example, a sinusoidal divider circuit using regeneration and modulation techniques or a locked sinusoidal oscillator such as those described in Millman, Jacob and Taub, Herbert, "Pulse, Digital, and Switching Waveforms; Devices and Circuits for their Generation and Processing" McGraw-Hill Book Company, New York, 1965, pp. 738–741, are equally satisfactory. Further, although the embodiment of FIGS. 2–4 have been described for generating subharmonic frequencies at one-half the original frequencies, it will be evident that other subharmonics can be generated and added to the original signal.

Figure 5:
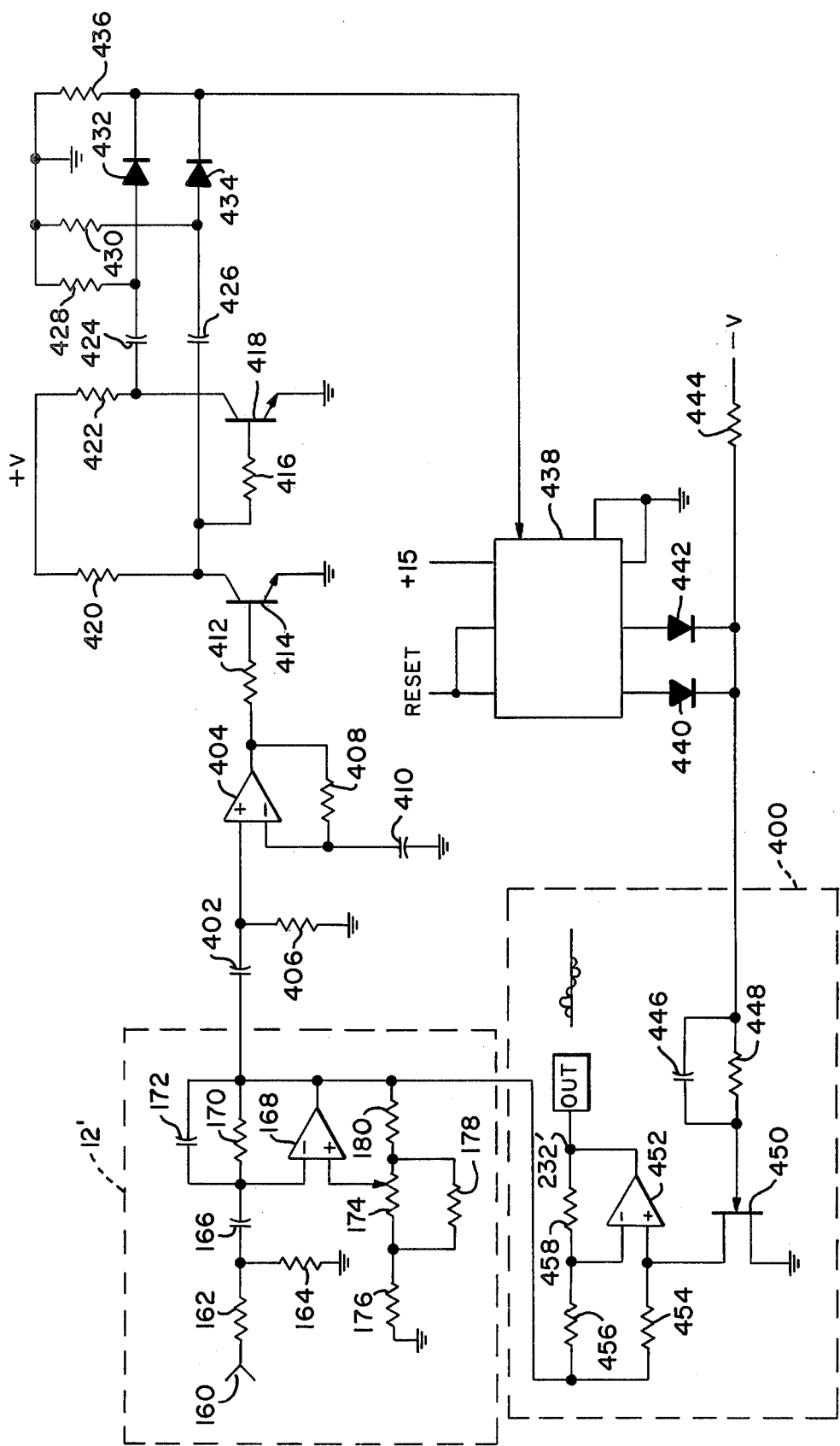
FIG. 5 is a schematic drawing of another embodiment of a bandpass filter and subharmonic frequency generator useful in the FIG. 3 embodiment for generating subharmonic frequencies equal to one-third the original frequencies.

For example, referring to FIG. 5, filters 12', subharmonic generators 14' can be substituted for the corresponding filters 12 and generators 14 of FIGS. 2-4 so that subharmonic frequencies at one-third the frequencies of the components of the original signal appearing at input terminals 10A and 10B, can be generated and added to the original signal through combiner circuit 32 and summing means 20. More specifically, referring to FIG. 5, a filter 12' and generator 14' is provided for each of the filters 12 and generators 14 shown in FIG. 2. As shown, Filter 12' is identical to filter 12 except that the band pass characteristics of each filter 12' is chosen so that the desired subharmonic frequencies are derived from those components passed through each filter. These bandpass characteristics are determined by the predetermined values of the particular components of filter 12', as will be obvious to one skilled in the art.

The output from amplifier 168 of filter 12' is connected to the input of −2, +1 gain circuit 400 and through capacitor 402 to the positive input of comparator 404, the positive input of comparator 404 being biased to ground through resistor 406. The negative input of comparator 404 is connected to ground through capacitor 410 and to its output through feedback resistor 408. The output of comparator 404 is connected through resistor 412 to the base of transistor 414. The collector of transistor 414 is connected through resistor 416 to the base of transistor 418. The emitters of transistor 414 and 418 are connected to system ground, while their collectors are connected through respective biasing resistors 420 and 422 to a positive DC biasing voltage. The collectors of transistors 414 and 418 are connected to a differentiator. Specifically, each differentiator includes a capacitor and resistor, wherein the collector of transistor 414 is connected to capacitor 426, which in turn is connected to ground through resistor 430 while, the collector of transistor 418 is connected to capacitor 424, which in turn is connected through resistor 428 to ground. As will be more evident hereinafter the values of capacitor 424 and 426 and resistor 428 and 430 are chosen so as to provide a relatively fast discharge, e.g. 1 msec. when compared to the time of a cycle of the original signal appearing at the output of filter 12' and in particular the length of the pulses provided at the output of comparator 404.

The outputs of the differentiators are connected to the inputs of an OR gate. Specifically, capacitor 424 is connected to the anode of diode 432, which capacitor 426 is connected to the anode of diode 434. The cathodes of diodes 432 and 434 are connected (1) together, so as to form the output of an OR gate, (2) to ground through resistor 436 and (3) to the input of a divide-by-six counter 438. Preferably, counter 438 is a divide-by-eight counter such as the CD4022A type, manufactured by RCA, with the sixth count output connected to its reset input so that the counter counts from one to six and resets on the next count to repeat the count one to six, etc. The outputs of counter 438 corresponding to the second and fifth counts are connected to the respective anodes of diodes 440 and 442. The cathodes of the latter are connected together and (1) biased to a negative DC bias voltage and (2) connected to the control terminal of the −2, +1 gain circuit 400.

More particularly, the cathodes of diodes 440 and 442 are connected through capacitor 446 and through resistor 448 to the control gate of FET transistor 450. The main terminals of transistor 450 are connected to ground and to the positive input of operational amplifier 452. The positive and negative inputs of amplifier 452 are connected to receive the output of filter 12 through resistor 454 and 456, respectively. The negative input of amplifier 452 is connected through feedback resistor 458 to its output. The values of resistors 454, 456 and 458 are chosen so that the gain of amplifier 452 is +1 when transistor 450 is nonconductive or off and −2 when transistor 450 is conductive or on. The output of amplifier 452 is connected to the output terminal 232'. Output terminal 232' is connected to a summing resistor 16 of FIG. 3B.

Figure 6:
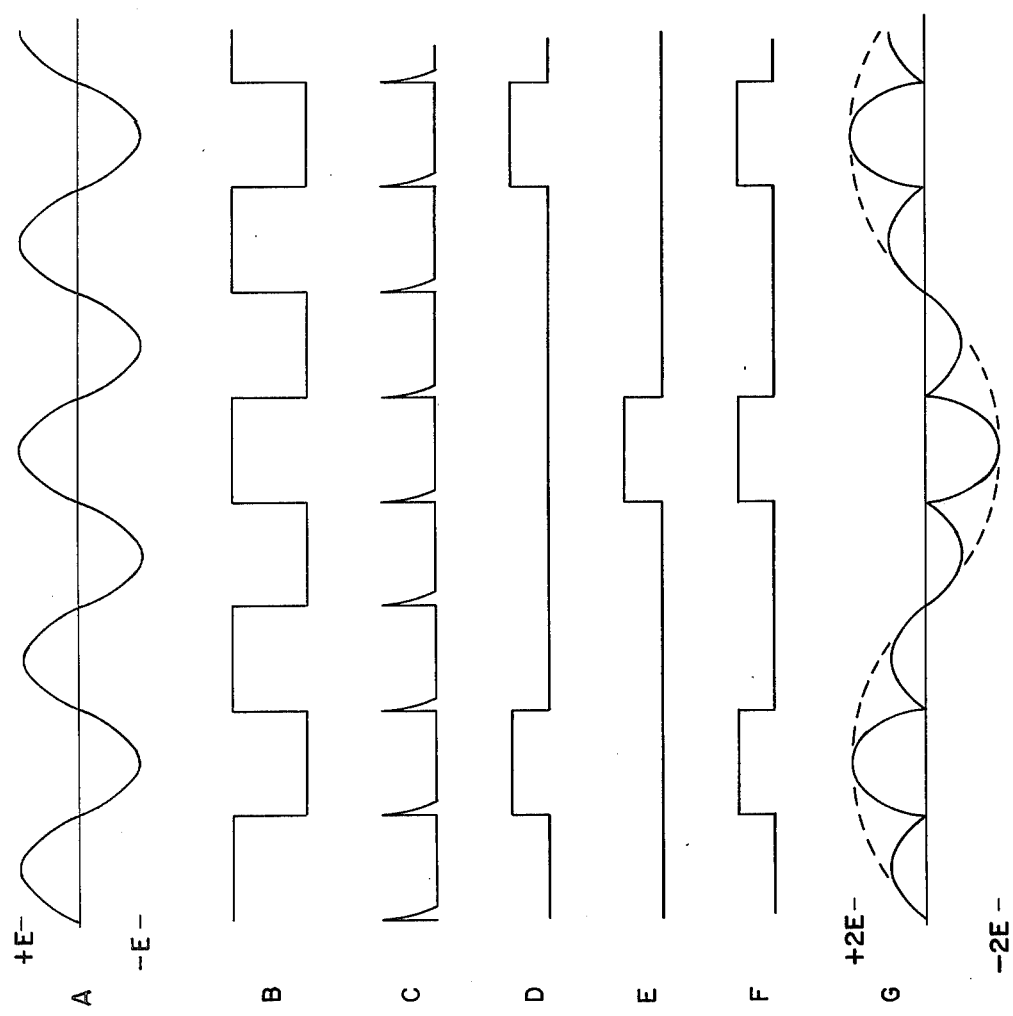
FIG. 6 is a timing diagram associated with the operation of the subharmonic generator shown in FIG. 5.

The operation of the filter and subharmonic generator circuit shown in FIG. 5 is described with reference to the timing diagram shown in FIG. 6. More specifically, a typical signal (for simplicity shown as a signal of a constant single frequency) shown in FIG. 6A is applied through capacitor 502 to the positive input of comparator 404. The output of comparator 404, shown in FIG. 6B is essentially a square wave which is positive and negative when the waveform of the signal of FIG. 6A is correspondingly positive and negative.

The output square wave form of FIG. 6B is applied through resistor 412 to the base of transistor 414. The arrangement provided by transistors 414 and 418, and resistors 416, 420 and 422 is that of an RS flip flop so that when the square wave form of FIG. 6B is positive, a positive pulse is provided to the differentiator provided by capacitor 426 and resistor 430, when the square waveform is negative, a positive pulse is provided to the differentiator provided by capacitor 424 and resistor 428. Due to the relatively short time constant of the differentiators, each provides a positive spike for each positive transition of the pulses provided by the flip flop (i.e. when they go positive) and a negative spike for each negative transition of the pulse provided by the flip flop (i.e. when they go negative). Due to the nature of diodes 432 and 434, (i.e. they conduct only the positive spikes of each) the output of the diodes, and thus the input to counter 438 is a series of positive spikes as shown in FIG. 6C, corresponding to both the positive and negative transitions of the square wave form of FIG. 6B. It will be appreciated that each of these spikes essentially represent a half-cycle of the signal waveform of FIG. 6A. The spikes essentially provide the counting input to counter 438, so that as shown in FIGS. 6D and 6E, on every second and fifth count of every six, the outputs of the counters, i.e. the outputs of diodes 440 and 442, is such that a pulse is provided. The outputs of diodes are summed as shown in FIG. 6F and applied to the control terminal of +1-2 gain circuit 400. As previously described, when a pulse is provided to the gate terminal of transistor 450, the latter is conductive so that the gain of the amplifier 452 is −2; and when no pulse is provided the transistor 450 is nonconductive and the gain of amplifier 452 is +1. Thus, as shown in FIG. 6G, the output of amplifier 452 at terminal 232', will provide a waveform in which the gain of amplifier 452 is +1 when the first half wave of the original signal (positive) is applied to amplifier 452 so as to provide at terminal 232 the same half-wave signal. On count two, a pulse is provided through diode 440 so as to place transistor 450 in a conductive state and change the gain of amplifier 452 to −2. Since the signal input is now negative, the output of amplifier 452 at terminal 232' will be positive, at twice the amplitude of the input. On count three, transistor 450 is nonconductive and the gain of amplifier 452 changes to +1. Since the signal input is now positive it is transmitted to terminal 232' with no gain change. On count four, transistor 450 remains nonconductive and the gain of amplifier 452 remains +1. Thus, the negative half wave of the signal input from filter 12' is transmitted to terminal 232' with no gain change. On count five, a pulse is provided through diode 442 so as to place transistor 450 in a conductive state and change the gain of amplifier 452 to −2. Since the signal input is now positive, the output of amplifier 452 at terminal 232' will be negative at twice the amplitude of the input. Finally, on count six, transistor 450 is once again nonconductive and the gain of amplifier 452 changes back to +1. Since the signal input is now negative it is transmitted to terminal 232' with no gain change. The next count, will be count one so that the process repeats.

As shown in FIG. 6G, the envelope of the waveform provided at terminal 232' is a signal having a frequency at one-third the frequency of the original signal of FIG. 6A. The low pass filter 42 shown in FIG. 2 and in detail in FIG. 3B is provided with a cut off so that only the envelope of the signal shown in FIG. 6G is transmitted therethrough. Thus, when the original signals derived from the inputs at terminals 10A and 10B and filtered through the filters 12', each subharmonic generator of the type described with respect to FIG. 5 and receiving an output from a filter, generates a waveform of the type shown in FIG. 6G. As shown in FIG. 2 each waveform output of each generator is summed through resistors 16 and applied to low pass filter 42. The latter provides the envelope form of the waveforms, to the gain control module 24. The operation of the remaining portion of FIG. 2 operates in the same manner as previously described so that the subharmonic frequencies at one-third the frequencies of the signals provided by filters 12' are added through summing means 20A and 20B to the original stereophonic signals.

Since certain changes may be made in the above apparatus without departing from the scope of the invention herein involved, it is intended that all matter contained in the description and the accompanying drawing shall be interpreted in an illustrative and not in a limiting sense.

What is claimed is:

1. Apparatus for synthesizing from an audio signal, an enhanced audio signal, said apparatus comprising, in combination:
   means for sensing signal energy of said audio signal within a preselected frequency portion of said audio signal and for dividing said sensed signal energy into a plurality of discrete bands according to the frequency thereof;
   means, responsive to the signal energy in each of said bands, for generating a like plurality of second signals each of which includes frequency componenets which are subharmonics of the frequencies of the corresponding frequency band;
   means for combining said plurality of second signals so as to provide a combined signal; and
   means for adding said combined signal to said audio signal to provide said enhanced audio signal.

2. Apparatus according to claim 1, further including means for generating a control signal logarithmically related to the amplitude of said portion of said audio signal, and amplifying means for amplifying said combined signal by a gain variable responsively to said control signal.

3. Apparatus for synthesizing from a pair of stereophonic audio signals, a pair of enhanced audio signals, said apparatus comprising, in combination:
   means for sensing signal energy of said pair of stereophonic audio signals within a preselected frequency portion of said stereophonic audio signals and for dividing said sensed signal energy into a plurality of discrete bands according to the frequency thereof;
   means responsive to the signal energy in each of said bands, for generating a like plurality of second signals, each of which includes frequency components which are subharmonics of the frequencies of the corresponding frequency band;
   means for combining said plurality of second signals so as to provide a combined signal; and
   means for adding said combined signal to each of said stereophonic audio signals to provide said enhanced audio signals.

4. Apparatus according to claim 3, wherein said means for sensing signal energy senses the monophonic sum of the signal energy of said pair of stereophonic audio signals within said preselected frequency portion.

5. Apparatus according to claim 3, wherein said discrete bands are continuous.

6. Apparatus according to claim 5, wherein said discrete bands each have a bandwidth of 10 Hz.

7. Apparatus according to claim 3, wherein said means for generating said second signals includes means, responsive to the signal energy in each of said bands, for generating a third signal having frequency components which are half the frequencies of the corresponding frequency band, and means for modulating the sensed signal energy within each of said frequency bands with the corresponding one of said third signals.

8. Apparatus according to claim 7, wherein said means for modulating includes a double balance modulator.

9. Apparatus according to claim 3, further including means for generating a control signal logarithmically related to the amplitude of said portion of said stereophonic audio signals, and amplifying means for amplifying said combined signals by a gain variable responsively to said control signal.

10. Apparatus according to claim 9, wherein said control signal is logarithmically related to the RMS value of the amplitude of the monophonic sum of said portion of said stereophonic audio signals.

11. Apparatus according to claim 9, further including means, coupled to the output of said means for generating said control signal, for modifying said control signal so that said control signal dynamically responds in a non-linear manner to changes in the output of said means for generating said control signal.

12. Apparatus according to claim 11, wherein said means for modifying said control signal allows very long smoothing constants to be applied to said control signal when said control signal is a steady state or slowly varying signal, and allows very rapid signal changes to effect a relatively rapid change in said control signal when the output of said means for generating said control signal changes rapidly.

13. Apparatus according to claim 9, wherein said amplifying means includes operational amplification means having negative and positive inputs the gain of said negative and positive inputs being equal and the output of said amplification means is substantially zero when said control signal is substantially zero, said amplifying means further including switching means for varying the gain at one of said input terminals responsively to the amplitude of said control signal.

14. Apparatus according to claim 3, wherein said subharmonics are at one-half the frequencies of the corresponding band.

15. Apparatus according to claim 3, wherein said subharmonics are at one-third the frequencies of the corresponding band.

16. Apparatus according to claim 15, wherein said means for generating said second signals includes means, responsive to the signal energy in each of said bands, for amplifying said signal energy in each band by a first predetermined gain every first, third, fourth and sixth of every six consecutive half-cycles of said signal energy and by a second gain, equal to said first predetermined gain multiplied by a factor of minus two, every second and fifth of every six consecutive half-cycles of said signal energy.

* * * * *